(12) United States Patent
Shinoda et al.

(10) Patent No.: US 7,502,403 B2
(45) Date of Patent: Mar. 10, 2009

(54) SEMICONDUCTOR LASER AND OPTICAL MODULE

(75) Inventors: Kazunori Shinoda, Musashino (JP); Koichiro Adachi, Musashino (JP); Hideo Arimoto, Kodaira (JP)

(73) Assignee: Opnext Japan, Inc., Kanagawa (JP)

( * ) Notice: Subject to any disclaimer, the term of this patent is extended or adjusted under 35 U.S.C. 154(b) by 0 days.

(21) Appl. No.: 11/831,986

(22) Filed: Aug. 1, 2007

(65) Prior Publication Data

US 2008/0266638 A1    Oct. 30, 2008

(30) Foreign Application Priority Data

Apr. 26, 2007   (JP) .............................. 2007-117393

(51) Int. Cl.
*H01S 3/08*   (2006.01)
*H01S 5/00*   (2006.01)

(52) U.S. Cl. ................. 372/50.23; 372/108; 372/50.11; 372/101

(58) Field of Classification Search ................ 372/101, 372/108, 50.11, 50.1, 50.23
See application file for complete search history.

(56) References Cited

U.S. PATENT DOCUMENTS

2002/0003824 A1   1/2002  Yu-Hwa et al.
2002/0085612 A1   7/2002  Young-Gu et al.
2005/0123016 A1   6/2005  Behfar et al.
2005/0157770 A1   7/2005  Behfar et al.

FOREIGN PATENT DOCUMENTS

JP     2004-235182    8/2004
JP     2007-005594    1/2007

OTHER PUBLICATIONS

B. Stegmuller, et al.; Surface Emitting InGaAsP/InP Distributed Feedback Laser Diode at 1.53 um with Monolithic Integrated Microlens; IEEE Photonics Technology Letters, Sep. 1991; pp. 776-778; vol. 3, No. 9.

*Primary Examiner*—Minsun Harvey
*Assistant Examiner*—Marcia A. Golub
(74) *Attorney, Agent, or Firm*—Antonelli, Terry, Stout & Kraus, LLP.

(57) ABSTRACT

In a horizontal cavity surface emitted laser, there is provided a device structure that is capable of obtaining a circular narrow-divergence emitted beam that is high in the optical coupling efficiency with a fiber. As a first means, there is provided a horizontal cavity surface emitting laser having a structure in which the plane mirror that is inclined by 45° and the bottom lens of the oval configuration are integrally structured. As a second means, there is provided a horizontal cavity surface emitting laser in which the mirror having the columnar front surface configuration inclined by 45° and the bottom lens of the columnar front surface configuration are integrally structured. Since the horizontal component and the vertical component of the laser beam can be shaped, independently, through the above means. As a result, it is possible to obtain the circular narrow-divergence emitted beam.

3 Claims, 12 Drawing Sheets

SEMICONDUCTOR LASER AND OPTICAL MODULE

CLAIM OF PRIORITY

The present application claims priority from Japanese application JP 2007-117393 filed on Apr. 26, 2007, the content of which is hereby incorporated by reference into this application.

FIELD OF THE INVENTION

The present invention relates to semiconductor lasers such as lasers for optical communication systems or lasers for optical disc systems, and an optical module such as an optical transceiver module or a can module into which the semiconductor laser is incorporated.

BACKGROUND OF THE INVENTION

The semiconductor lasers are classified into the following three kinds of semiconductor lasers according to the combination of the cavity direction and the laser beam emitting direction. A first semiconductor laser is a horizontal cavity edge emitting laser, a second semiconductor laser is a vertical cavity surface emitting laser, and a third semiconductor laser is a horizontal cavity surface emitting laser. The first horizontal cavity edge emitting laser is designed in such a manner that an optical waveguide is formed in a horizontal direction within a substrate surface, and a laser beam is emitted from a facet obtained by dividing the substrate by cleaving. The above laser configuration is suitable to obtain a high output power and is most generally spread since the cavity length can be extended to about several hundreds. However, in the case of using this configuration, it is necessary to cleave the semiconductor substrate during a fabrication process. For that reason, the fabrication process and testing cannot be conducted without cleaving the wafer, resulting in such a demerit that the manufacture costs are increased.

Figure 1A:
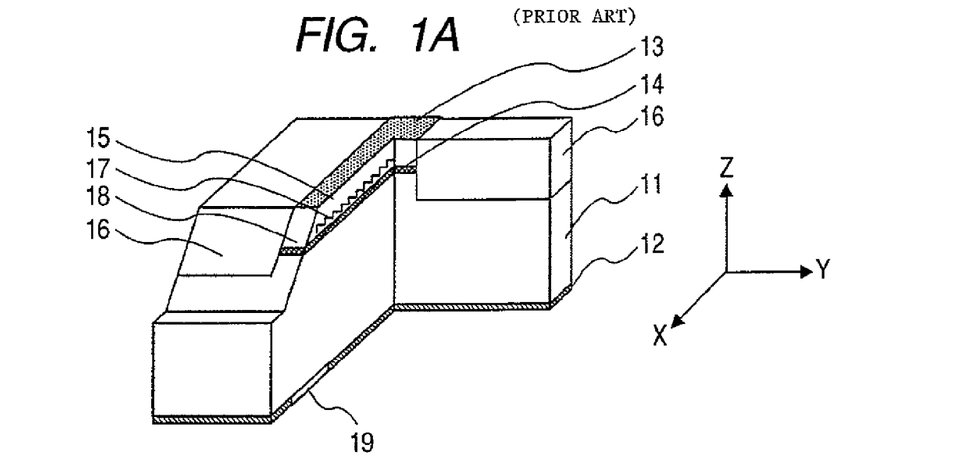
FIG. 1A is a perspective view showing a device cross section.
Figure 1B:
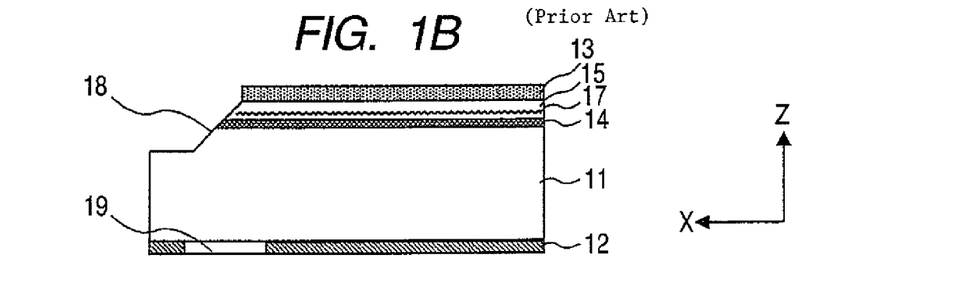
FIG. 1B is a cross-sectional view of the device along an optical axial direction.
Figure 1C:
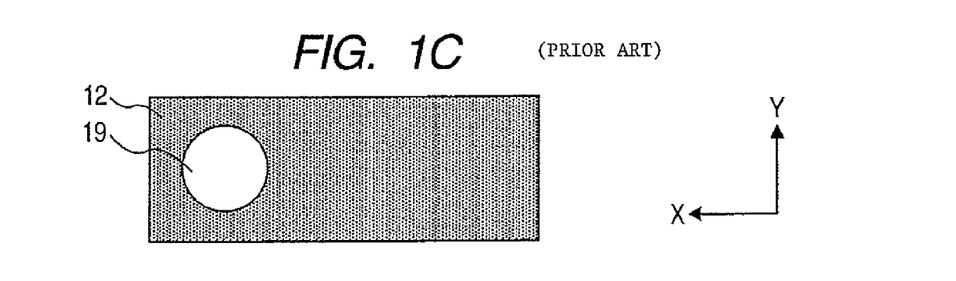
FIG. 1C is a diagram showing a lower surface of the device.
Figure 1D:
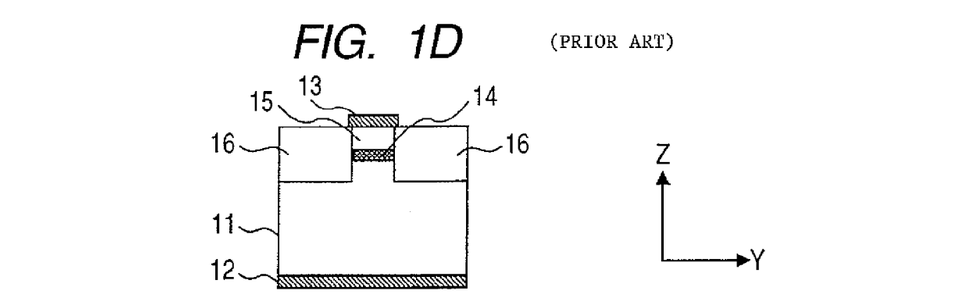
FIG. 1D is a cross-sectional view of the device in a direction perpendicular to the optical axis.

The second vertical cavity surface emitting laser has such a configuration in which a cavity is formed in a direction perpendicular to the semiconductor substrate. For that reason, since it is unnecessary to cleave the substrate in order to form the cavity, there is an advantage that the fabrication and inspection of the laser can be conducted by the full wafer as it is, and the manufacture costs can be suppressed lowly. However, this configuration suffers from such a problem that the cavity length is very short because the cavity length is determined according to the crystal growth film thickness, and it is essentially difficult to obtain a high output power. On the contrary, the third horizontal cavity surface emitting laser has a laser configuration with the excellent points of the above two lasers. In this configuration, a cavity is formed in a horizontal direction on the substrate surface, and a mirror that is inclined by 45° for emitting the laser beam from a front surface or a rear surface of the substrate are integrated together. The present invention relates to a horizontal cavity surface emitting laser. The structural example of the horizontal cavity surface emitting laser will be described with reference to FIGS. 1A to 1D. FIG. 1A is a perspective view showing the cross section of the device, FIG. 1B is a cross sectional view showing the optical axial direction of the device, FIG. 1C is a diagram showing a lower surface of the device, and FIG. 1D is a cross sectional view perpendicular to the optical axis. The configuration of the device will be described hereinafter assuming that a surface on which the semiconductor substrate is placed is an x-y plane, a normal direction to the semiconductor substrate surface is a z-axial direction, and the optical axis direction of the laser cavity is an x-axial direction in order to three-dimensionally show the configuration of the laser.

This device is formed on an n-type InP substrate 11. A light is generated by injecting currents into an InGaAsP active layer 14 from an n-type electrode 12 of the substrate rear surface and a p-type electrode 13 of the substrate front surface. The generated beam is confined to an optical confinement configuration consisting of a p-type InP cladding layer 15, the active layer 14, and the n-type InP substrate 11 in the z-direction. Also, the beam is confined to an optical confinement configuration consisting of a semi-insulated InP layer 16, the active layer 14, and the semi-insulated InP layer 16 in the y-direction. In this way, the beam that is confined in the y-direction and the z-direction is propagated in the x-axial direction. A grating 17 that periodically changes the refractive index is formed in the x-axial direction along which the light is propagated. The light is fed back by the grating 17, and lasing is conduced. This laser is a so-called distributed feedback (DFB) laser. The laser beam thus generated is totally reflected by the mirror 18 that is formed by etching on one end of the waveguide with an angle of 45°, and then guided in the substrate rear surface direction. An anti-reflective coating film 19 is formed on a portion of the substrate rear surface which faces the 45° mirror, and the laser beam is emitted from the substrate rear surface.

In the horizontal cavity surface emitting laser with the above configuration, since the cavity is formed within the substrate plane, the cavity length can be extended, thereby making it easy to obtain a high output power. Also, since a light is emitted in a direction perpendicular to the substrate surface, it is possible to fabricate and test the laser in the full wafer process, and the costs expended for the manufacture are lowly suppressed. As a known example of the conventional horizontal cavity surface emitting laser, JP-A No. 2004-235182 discloses a horizontal cavity surface emitting laser having a distributed Bragg reflector that is formed on the semiconductor substrate, an optical waveguide layer that is formed on the reflector, and a reflector that is formed on an end of the optical waveguide layer with an angle of 45°. Also, as another known example, JP-A No. 2007-5594 discloses a horizontal cavity surface emitting laser having an active region of 10 to 100 μm, a distributed Bragg reflector, and an oblique mirror. Also, as a third known example, "IEEE Photonics Technology Letters" Vol. 3, No. 9, p. 776 reports the room temperature continuous-wave lasing characteristics of a horizontal cavity surface emitting laser having an optical waveguide with an InGaAsP active layer that is formed on an InP substrate, a reflector that is formed on an end of the optical waveguide with an angle of 45°, and a circular lens that is formed at a position that faces the reflector.

SUMMARY OF THE INVENTION

Figure 2:
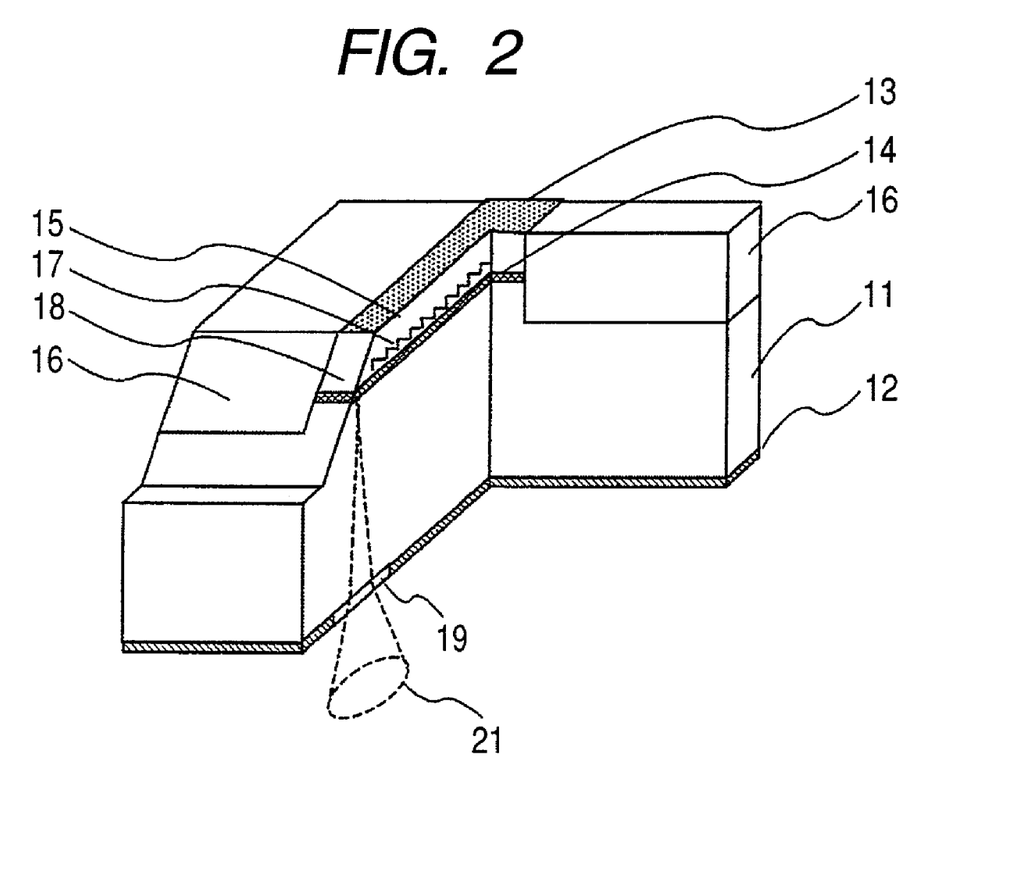
FIG. 2 is a diagram for explaining a problem to be solved by the present invention.

The conventional horizontal cavity surface emitting laser suffers from such a problem that the laser emitted beam is oval. In the horizontal cavity surface emitting laser, the waveguide dimensions in the lateral direction (y-direction) and the vertical direction (z-direction) are generally different from each other, and the laser beam has a rectangular contour that is usually longer in the y-direction and shorter in the z-direction. For that reason, a spread angle of the beam that is totally reflected by the 45° reflector and emitted from the substrate rear surface side in the x-direction is larger than that in the y-direction. For that reason, the emitted laser beam 21 has an oval contour having the diameter in the x-direction larger than the diameter in the y-direction as shown in FIG. 2.

However, in the case where the laser beam that is emitted from the semiconductor laser is coupled to a fiber or the like, it is desirable that the beam contour of the laser beam is circular, and the narrow beam divergence is provided in order to reduce the coupling efficiency of the laser beam. Accordingly, a phenomenon that the beam contour becomes oval as described above is a problem to be solved from the viewpoint of a reduction in the optical coupling efficiency.

The above problem cannot be solved by merely forming the circular lens on the substrate rear surface as disclosed in "IEEE Photonics Technology Letters" Vol. 3, No. 9, p. 776. It is needless to say that the beam spread angle can be reduced by forming the circular lens, but since the radius of curvature of the circular lens is identical between the x-direction and the y-direction, it is impossible to shape the beam contour so as to approach the circle. As described above, in the conventional technique, it is impossible to obtain a desirable circular narrow emitted beam divergence from the viewpoint of the reduction in the optical coupling efficiency in the horizontal cavity surface emitting laser.

A first object of the present invention is to provide a horizontal cavity surface emitting semiconductor laser that emits a circular narrow-divergence emitted beam and is high in the coupling efficiency between the fiber and the optical waveguide. Also, a second object of the present invention is to provide an optical module that is high in the optical coupling efficiency. Further, a third object of the present invention is to provide an optical transceiver that is high in the optical coupling efficiency.

A main object of the present invention is achieved by the following semiconductor laser. The semiconductor laser includes: a semiconductor substrate; an active layer formed on a main surface of the semiconductor substrate which generates light; an optical waveguide for propagating the light that is generated from the active layer; a resonant cavity structure for optical feedback along the propagation direction; a mirror for emitting the laser beam emitted from the cavity in a substrate rear surface direction; and a lens having a curved semiconductor surface at the substrate rear surface side for emitting the laser beam reflected by the mirror, wherein when it is assumed that the semiconductor substrate is an xy plane of right-hand orthogonal coordinates, and the optical axial direction of the optical waveguide is in parallel to the x-axial direction, the normal direction to the mirror surface and the z-axial direction form an angle of 45°, and the laser beam is emitted in the substrate rear surface direction, that is, the negative direction of the z-axis, wherein the outer peripheral configuration viewed from the substrate rear surface side of the lens is an oval configuration that satisfies the following relationship:

$$a^{-2}x^2 + b^{-2}y^2 = 1 \quad \text{(Ex. 1)}$$

where a and b are a radius in the x-axial direction and a radius in the y-axial direction, respectively, and satisfies a relationship of a<b, and wherein a that represents the radius in the x-axial direction and b that represents the radius in the y-axial direction meets a relationship of 3 μm<a<b<200 μm.

Also, another object of the present invention is achieved by the following semiconductor laser. The semiconductor laser includes: a semiconductor substrate; an active layer formed on a main surface of the semiconductor substrate which generates light; an optical waveguide for propagating the light that is generated from the active layer; a resonant cavity structure for optical feedback along the propagation direction; a mirror for emitting the laser beam emitted from the cavity in a substrate rear surface direction; and a lens having a curved semiconductor surface at the substrate rear surface side for emitting the laser beam reflected by the mirror, wherein when it is assumed that the semiconductor substrate is an xy plane of right-hand orthogonal coordinates, and the optical axial direction of the optical waveguide is in parallel to the x-axial direction, the laser beam is emitted in the negative direction of the z-axis, wherein the configuration of the mirror has a columnar surface configuration having a curvature, a center axis of the columnar configuration is inclined by an angle of 45° with respect to both of the z-axial direction and the x-axial direction, the configuration of the lens has a columnar surface configuration having a curvature, and the center axis of the columnar configuration is in parallel to the y-axial direction.

Hereinafter, the operation of the present invention will be described. The significant feature of the present invention resides in that a function of shaping the x-directional component and the y-directional component of the laser beam, independently, is integrated in the horizontal cavity surface emitting laser to realize the circular narrow-divergence emitted beam. As its specific realizing means, the present inventors have devised the following two device structures.

Figure 3A:
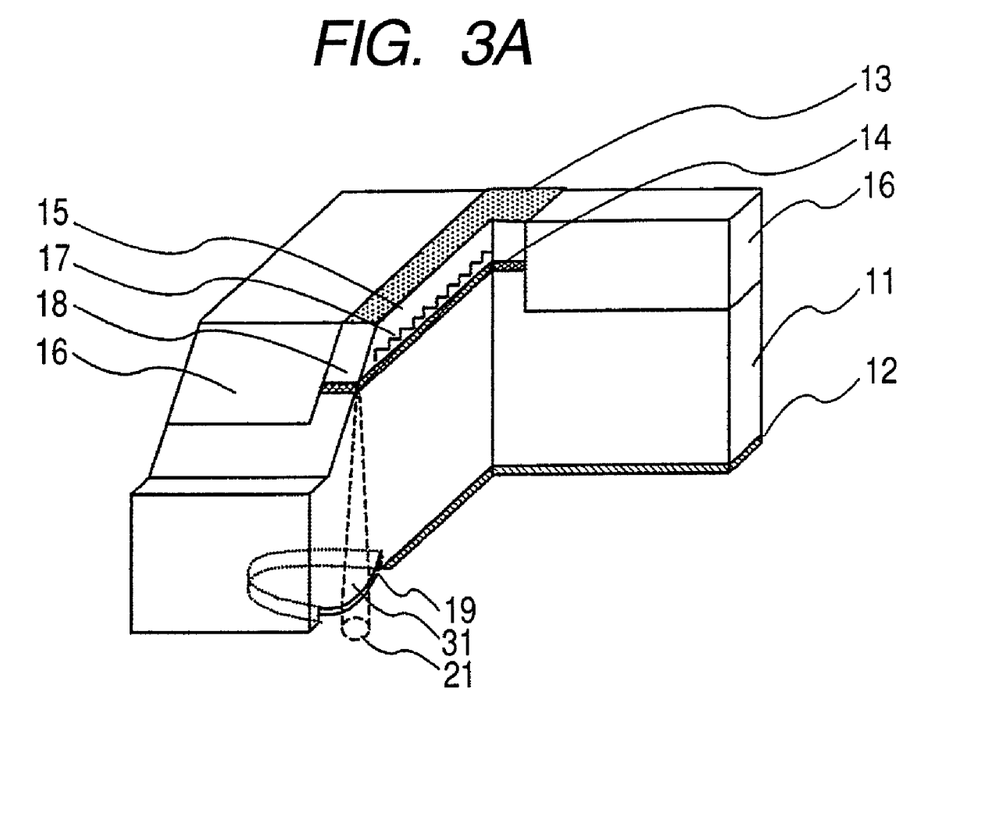
FIG. 3A is a perspective view showing a cross-sectional structure of the present device.
Figure 3B:
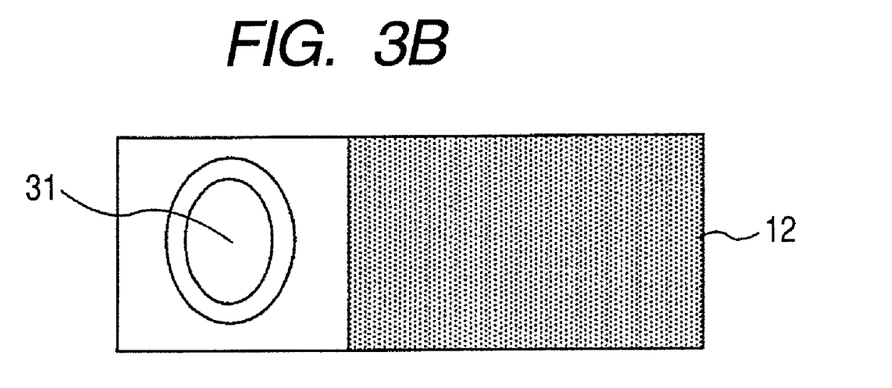
FIG. 3B is a diagram showing a lower surface of the present device.

A first device structure is that an oval lens is integrated in a portion of the substrate rear surface which emits the laser beam. The device structure is shown in FIGS. 3A and 3B. FIG. 3A is a perspective view showing the cross-sectional configuration of the device. FIG. 3B is a diagram of a lower surface of the device. In this configuration, the oval lens is formed on the rear surface of the substrate. Since the oval lens has the radius of curvature different between the x-direction and the y-direction of the lens front surface, the x-directional component and the y-directional component of the laser beam can be shaped with the lens configurations of suitable curvatures, independently. For that reason, as indicated by a chained line in the figure, the contour of the emitted beam 21 can be shaped into a circular narrow-divergence emitted beam. More specifically, the oval contour is set in such a manner that the radius a in the x-axial direction is shorter than the radius b in the y-axial direction, that is, a relationship of a<b is satisfied. When the dimensional range is further limited, the oval contour is set to dimensions that satisfy a relationship of 3 μm<a<b<200 μm. Now, a description will be given of a reason why the oval contour is so set as to satisfy a relationship of a<b. The reason is that in the case of the oval lens having the diameter in the x-axial direction shorter than the diameter in the y-axial direction, the radius of curvature in the lens configuration in the x-axial direction is smaller than that in the y-axial direction. For that reason, the beam component in the y-direction which is small in the spread angle can be shaped with the lens configuration which is large in the radius of curvature. That is, since the x-direction and the y-direction of the beam can be shaped with the lens configuration of the appropriate curvatures, respectively, it is possible to shape the emitted beam into the circular narrow-divergence emitted beam. Then, a description will be given of the reason why the preferable dimensional range of the oval configuration of the lens is limited to 3 μm<a<b<200 μm. The lower limit and the upper limit of the dimensional range of the oval configuration are regulated by the lower limit and the upper limit of the optical spot size. First, the lower limit of the radius of the optical spot in the x-axial direction will be studied. When it is estimated how is the lower limit of the optical spot in, for example, 1.3 μm laser, in the case where the optical radiation angle within the optical semiconductor is small, for example, 3°, and the thickness of the substrate is thin, that is, 50 μm, the spot radius is estimated as 3 μm.

Accordingly, in order to cover the optical spot, the radius of the optical spot in the x-axial direction must be larger than at least 3 µm. Subsequently, the upper limit of the radius of the optical spot in the y-axial direction will be studied. For example, when it is estimated how is the upper limit of the optical spot in, for example, 1.5 µm laser, in the case where the optical radiation angle within the optical semiconductor is large, for example, 13°, and the thickness of the substrate is thick, that is, 650 µm, the spot radius is estimated as 150 µm. Since the beam seeps outside of the spot, it is necessary to make the radius of the lens larger than 150 µm in order that the beam perfectly falls within the lens. However, in the case where the radius is equal to or larger than 200 µm, there arises such a problem that the curvature of the lens becomes smaller, and the beam shaping effect is insufficient. Therefore, it is preferable that the radius is not equal to or smaller than 200 µm. As a result of the above consideration, it is preferable that the dimensional range of the lens oval configuration is 3 µm<a<b<200 µm.

Figure 4:
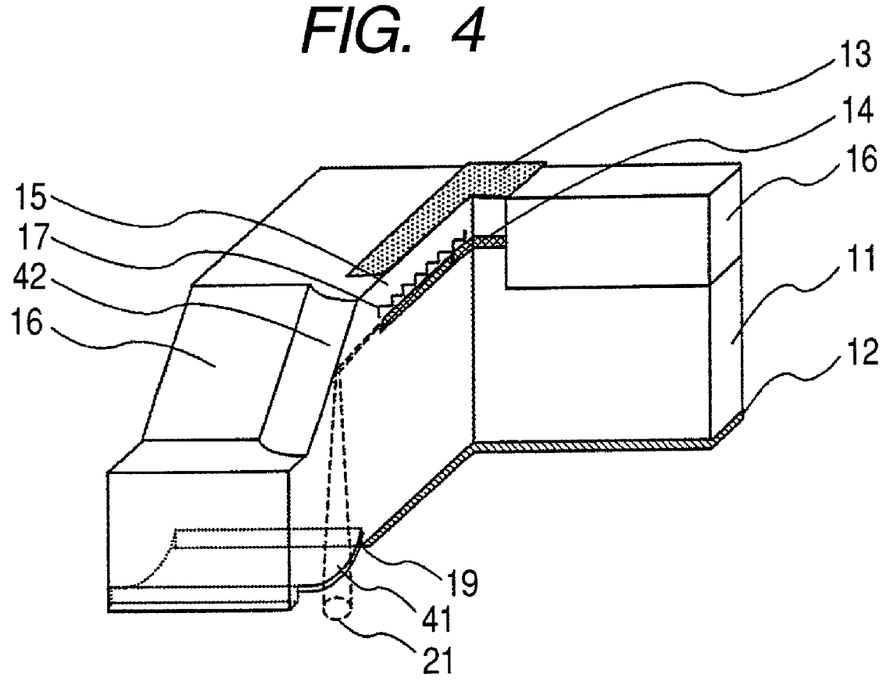
FIG. 4 is a diagram for explaining the operation of the present invention.
Figure 5A:
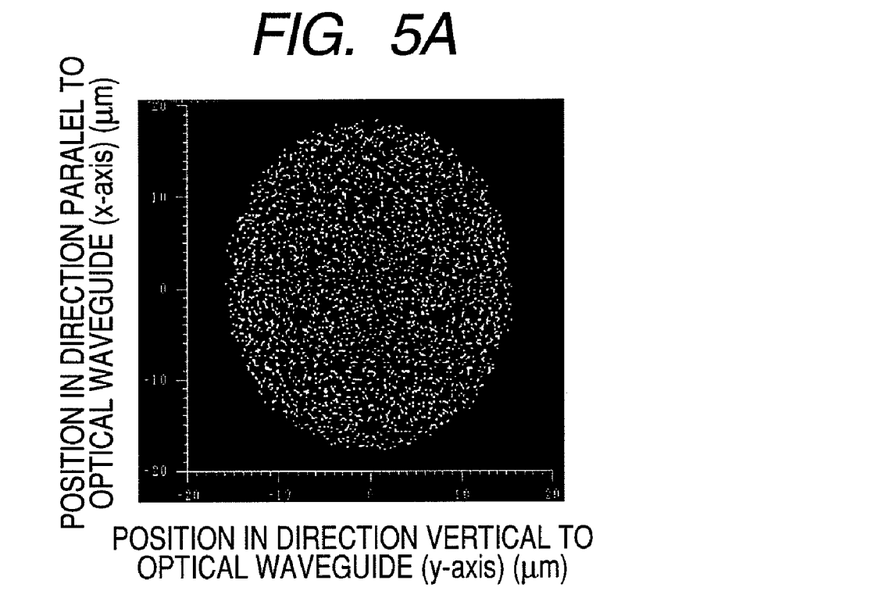
FIG. 5A is a diagram showing the calculation results of the emitted beam spot configuration of the laser having a plane mirror and a circular bottom lens in the conventional structure.
Figure 5B:
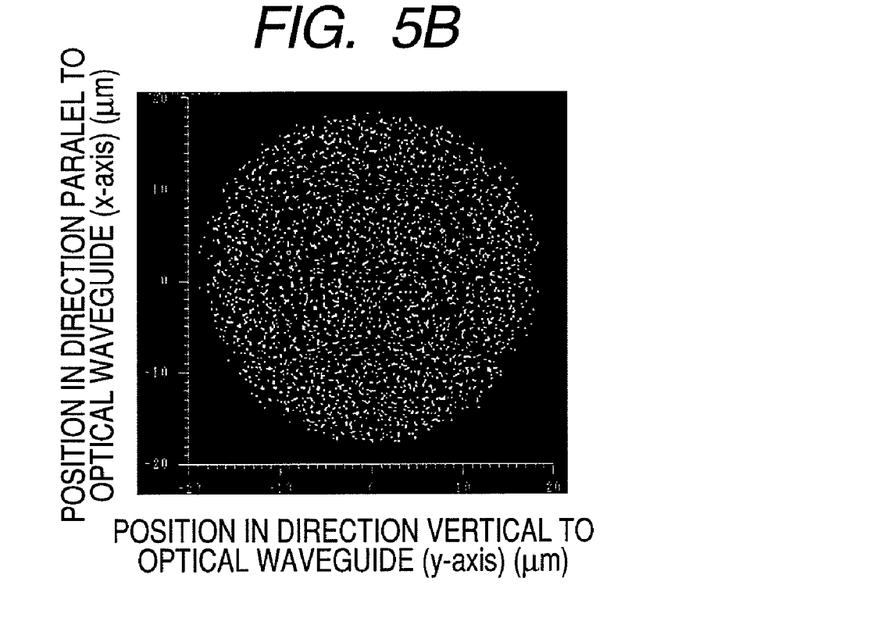
FIG. 5B is a diagram showing the calculation results of the emitted beam spot configuration of the laser having a mirror of the columnar front surface and a bottom lens of a circular front surface according to the present invention.

The second device structure is that both of the mirror that is inclined by 45° and a bottom lens are of the columnar front surface configuration. FIG. 4 shows a cross-sectional view of the structure. In this structure, the x-directional component of the laser beam is shaped by the bottom lens 41 of the columnar front surface configuration, and the y-component of the laser beam is shaped by the mirror 42 of the columnar front surface configuration. That is, since the x-directional component and the y-directional component of the laser beam can be shaped, independently, it is possible to obtain a circular narrow-divergence laser beam. The simulation results representing the action of the present invention are shown in FIGS. 5A and 5B. FIG. 5A shows the calculation results of the emitted beam spot configuration of the laser having the plane mirror and the circular bottom lens which is the conventional structure. FIG. 5B shows the calculation results of the emitted beam spot configuration of the laser having the mirror of the columnar front surface and the bottom lens of the columnar front surface. In this way, in the case of using the plane mirror and the circular bottom lens in the conventional art, the beam spot configuration is oval. On the other hand, in the case of using the mirror of the columnar front surface and the bottom lens of the columnar front surface configuration according to the present invention, it is understood that the circular beam spot configuration is obtained.

According to the present invention, it is possible to realize the horizontal cavity surface emitting laser that emits the circular narrow-divergence emitted beam. For that reason, it is possible to improve the optical coupling efficiency of the optical module using the present laser device or the optical transceiver. Also, since the high-precision alignment is not required at the time of mounting the laser by using the laser device of the present invention, the mounting process is facilitated, and it is possible to realize a remarkable reduction in the fabrication cost of the optical module or the optical transceiver.

BRIEF DESCRIPTION OF THE DRAWINGS

FIGS. 1A to 1D are diagrams for explaining the background art of the present invention, in which

FIGS. 3A and 3B are diagrams for explaining the operation of the present invention, in which

FIGS. 5A and 5B are diagrams for explaining the operation of the present invention, in which

FIGS. 6A to 6D are diagrams for explaining the operation of the present invention, in which

FIGS. 12A and 12B are diagrams for explaining a third embodiment of the present invention, in which

DETAILED DESCRIPTION OF THE PREFERRED EMBODIMENTS

Hereinafter, a description will be given of embodiments of the present invention with reference to the accompanying drawings.

First Embodiment

Figure 6A:
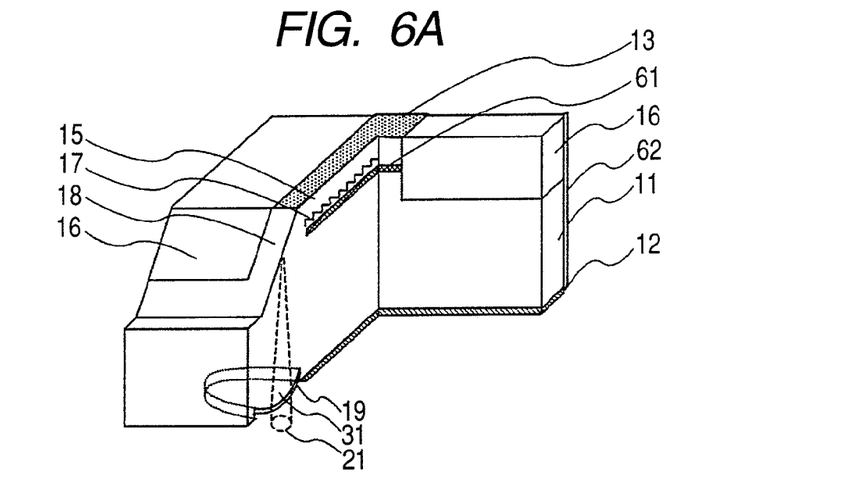
FIG. 6A is a perspective view of a cross section according to a first embodiment of the present invention.
Figure 6B:
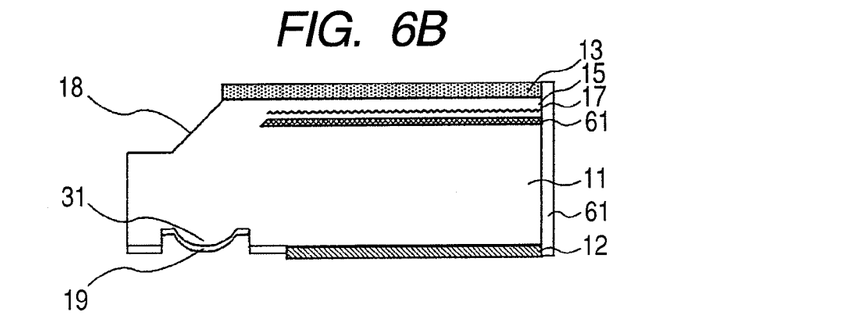
FIG. 6B is a cross-sectional view of a plane that is in parallel to a beam traveling direction.
Figure 6C:
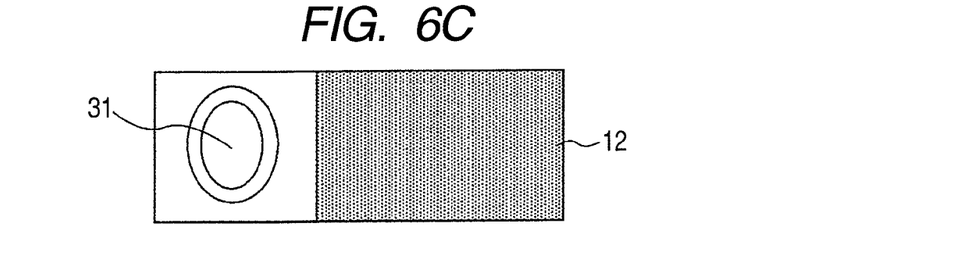
FIG. 6C is a diagram showing a lower surface of the device.
Figure 6D:
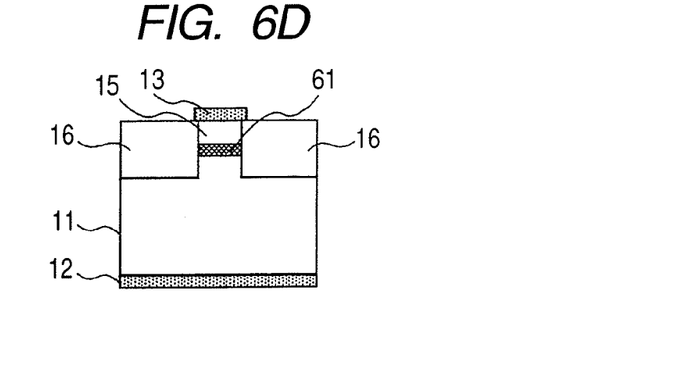
FIG. 6D is a cross-sectional view of a plane that crosses the beam traveling direction.

A first embodiment of the present invention will be described with reference to FIGS. 6A to 6D and 7A to 7G. This embodiment is directed to an InGaAlAs quantum well horizontal cavity surface emitting laser of 1.3 µm wavelength. FIG. 6A is a perspective view showing a cross section according to the first embodiment. FIG. 6B is a cross-sectional view of a plane that is in parallel to the beam traveling direction. FIG. 6C is a diagram showing a lower surface of the device. FIG. 6D is a cross-sectional view showing a plane that crosses the beam traveling direction. FIGS. 7A to 7G are cross-sectional views showing a process of manufacturing the device. As shown in FIGS. 6A and 6D, the optical waveguide of the device is processed into a stripe configuration, and has a buried hetero (BH) structure. This structure has been well known. In this example, a high-resistant iron-doped semi-insulated InP 16 is buried in the periphery of the stripe-shaped optical waveguide in the buried hetero structure.

Figure 7A:
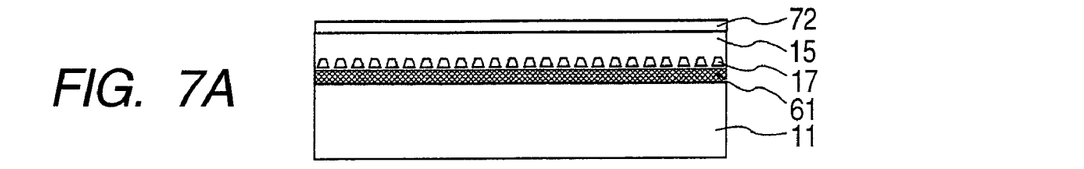
FIGS. 7A to 7G are diagrams for explaining the first embodiment of the present invention.

The cross-sectional view of the multiple layer structure in this embodiment is shown in FIG. 7A. A substrate is an n-type InP substrate 11. An active layer 61 is of a multiple layer structure including an n-type InGaAlAs optical confinement layer, an InGaAlAs strained multiple quantum well layer, and a p-type InGaAlAs optical confinement layer. The quantum well layer that forms the active layer is so designed as to consist of five periods of a well that is 7 nm in thickness and a barrier that is 8 nm in thickness, and realize a sufficient characteristic as a laser. A grating 17 that is made of an InGaAsP material is formed above those layers. The active region and the grating 17 are structured in such a manner that the lasing wavelength of a DFB laser at a room temperature becomes 1310 nm.

The optical confinement layer that sandwiches the quantum well layer is a layer for increasing the optical confinement of the quantum well layer. The optical waveguide function is developed by sandwiching the core region by the cladding layers that are lower in refractive index than the core region, and the optical waveguide function is realized by a multiple layer structure consisting of the cladding layer, the quantum well layer, and the cladding layer. In a specific embodiment, in order to increase the optical confinement in the quantum well layer, the quantum well layer is sandwiched by the optical confinement layers. For the purpose, the diffractive index of the cladding layers is set to be smaller than the diffractive index of the optical confinement layer. In this embodiment, the substrate assumes the role of the cladding layer at the substrate side. Alternatively, it is possible to additionally provide the substrate side cladding layer on the semiconductor substrate.

The polarity of the grating 17 is of p-type. This structure is called "index coupled DFB laser" since only the refractive index periodically changes in the beam traveling direction. In this embodiment, a description is given of an example in which the grating is uniformly formed on the entire region of the DFB laser. Alternatively, there can be provided so-called "phase shift" in which the phase of the grating is shifted in a part of the region as the occasion demands.

Figure 7B:
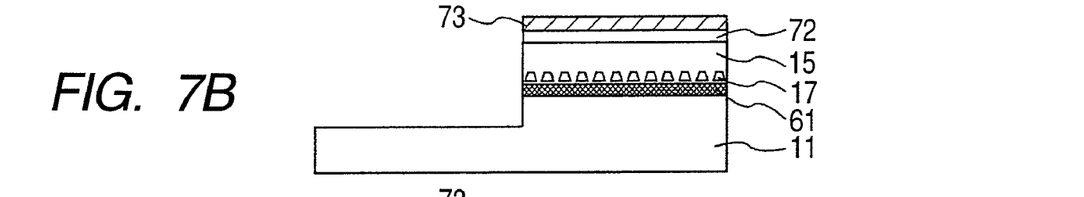

Subsequently, a manufacturing process according to this embodiment will be described with reference to FIGS. 7A to 7G. First, in order to form the structure of the laser, an InGaAlAs active layer 61 consisting of an n-type InGaAlAs optical confinement layer, an InGaAlAs strained multiple quantum well layer, and a p-type InGaAlAs optical confinement layer is formed on the n-type InP substrate 11. Then, a multiple layer structure including the grating layer 17 that is made of InGaAsP is formed above the InGaAlAs active layer 61. Further, a p-type InP cladding layer 15 and a p-type InGaAs contact layer 72 are formed on the multiple layer structure (FIG. 7A). A silicon dioxide film 73 is coated on an InP wafer having the multiple layer structure as a protective mask. As shown in FIG. 7B, the contact layer 72, the p-type cladding layer 15, the grating layer 17, and the active layer 61, and a part of the InP substrate are etched by the aid of the silicon dioxide mask 73, to thereby form an optical waveguide. In the etching, there can be used dry etching such as reactive ion etching (RIE) using, for example, chlorine-based gas, wet-chemical etching using bromine-based solution, or the combined use of those etchings.

Figure 7C:
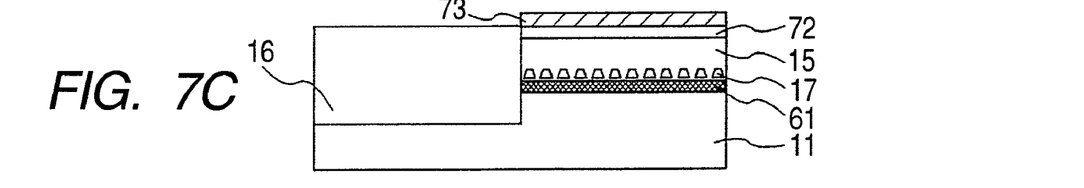

Subsequently, this sample is brought in a crystal growth reactor, and an Fe-doped semi-insulated InP layer 16 is regrown on the sample at 600° C. through a MOVPE method (FIG. 7C). The buried hetero structure is formed through the etching process and a process of regrowing the buried layer. In the buried hetero structure, a material that is capable of confining the beam is buried in both sides of the optical waveguide in the beam traveling direction. The material used for confinement is normally high in the resistance. In this example, the Fe-doped high-resistant semi-insulated InP 16 is used. FIG. 6D is a cross-sectional view of a plane of the device which crosses the beam traveling direction. The buried structure can be sufficiently understood from FIG. 6D.

In the buried structure forming process, the semi-insulated InP 16 is buried into an end of the optical waveguide at the optical emitting side, simultaneously while being buried into both sides of the optical waveguide in the beam traveling direction. The reason that the InP is buried in a leading end of the optical waveguide is because a portion of the 45° inclined mirror to be etched can be made of only the InP material, thereby making it easy to perfectly smoothly process the mirror to be etched.

Figure 7D:
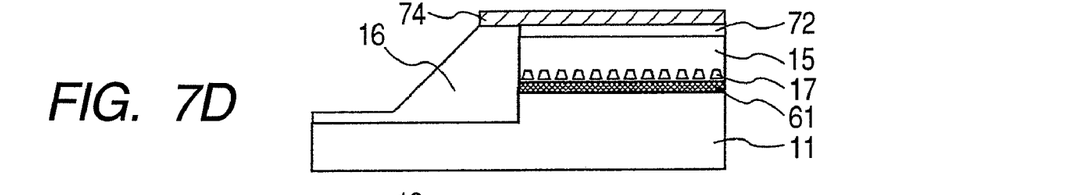

Thereafter, the silicon dioxide mask 73 that is used as a selective growth mask for the buried growth is removed to form a silicon nitride film for etching mask, and the Fe doped semi-insulated InP layer 16 is etched at an inclined angle of 45° (FIG. 7D). In the inclination etching, chemically assisted ion beam etching (CAIBE) using chlorine and argon gas is used, a wafer is inclined at an angle of 45°, and etched, to thereby realize etching of 45°. In this embodiment, the etching method using CAIBE is described. Alternatively, reactive ion beam etching (RIBE) of chlorine gas, or wet-chemical etching can be used.

Figure 7E:
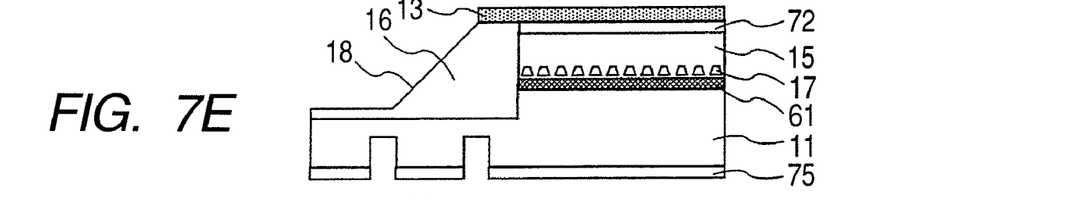
Figure 7F:
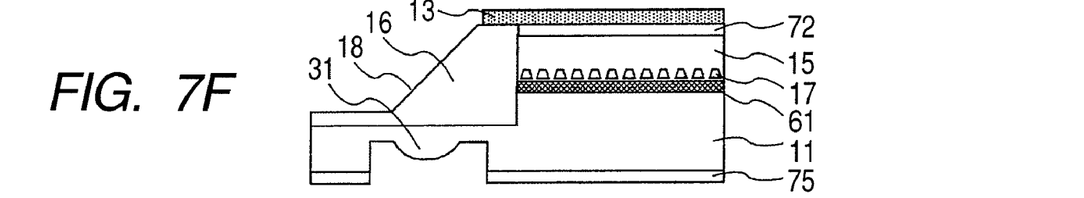
Figure 7G:
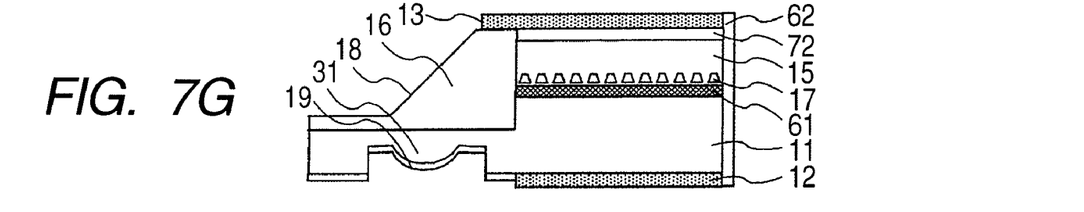

Then, after removal of the silicon nitride film 74, a p electrode 13 is deposited on an upper surface of a p-type InGaAs contact layer. Further, after the substrate rear surface is ground to the thickness of 100 μm, a silicon nitride mask 75 is formed on the substrate rear surface. Subsequently, the periphery of the lens portion is etched to a depth of 16 μm in the form of a doughnut through reactive ion etching using a mixed gas of methane and hydrogen (FIG. 7E). In this example, the configuration of the doughnut pattern is oval as shown in FIG. 6C, and the pattern is different in a diameter between in a direction parallel to the optical waveguide and in a direction perpendicular to the optical waveguide. Subsequently, the silicon nitride mask on the upper portion of a columnar portion surrounded by a portion that has been dug in the form of a doughnut is removed, and wet-chemical etching is conducted by the aid of a mixed solution containing hydrobromic acid, hydrogen peroxide, and water. As a result, the columnar portion is etched from the front surface so as to be rounded, and a lens configuration is formed on the InP of the bottom (FIG. 7F). In this example, the height of a convex of the lens configuration is 8 μm, and a radius of the lens oval configuration in parallel to the optical waveguide is 35 μm, and a radius of the optical waveguide in a direction perpendicular to the optical waveguide is 110 μm.

As described above, the oval configuration is different in the diameter of the lens between in a direction parallel to the optical waveguide and in a direction perpendicular to the optical waveguide, thereby making it possible to change the curvature of the lens between the direction parallel to the optical waveguide and the direction perpendicular to the optical waveguide. As a result, it is possible to shape the laser beam in the direction parallel to the optical waveguide and in the direction perpendicular to the optical waveguide, independently. Subsequently, the silicon nitride mask 15 is completely removed, and an antireflective coating film 19 that is made of silicon nitrided oxide is formed on the front surface of the lens. In addition, an n-side electrode 12 is formed. Also, a highly reflective coating film 62 used for the general semiconductor optical device is formed on the rear facet of the device.

In the horizontal cavity surface emitting laser, an average value of the slope efficiency at a room temperature under the continuous-wave condition is 0.4 W/A, and the high-efficiency lasing characteristics are exhibited. Also, the advantages of the present invention are reflected, and there is obtained a narrow-divergence emitted beam that is a perfect circular beam spot that is 50 μm in the diameter at a position of 100 μm from the rear surface of the laser. On the other hand, in a laser device whose bottom lens configuration is circular, which has been fabricated for comparison in order to exhibit the advantages of the present invention, the beam spot at a position of 100 μm from the laser rear surface has the oval configuration that is 40 μm in the diameter of a shorter axis and 60 μm in the diameter of a longer axis.

As a result, it is found that the horizontal cavity surface emitting laser of the circular narrow-divergence emitted beam is obtained from the advantages of the present invention. Also, as a result of conducting a constant output power life test with 5 mW at 50° C. with respect to the laser device of the present invention, one million hours are obtained as an estimated mean time to failure, and it is proved that the laser device of the present invention is high in reliability.

In this embodiment, the present invention is applied to the InGaAlAs quantum well laser that is 1.3 μm in the wavelength band which is formed on the InP substrate. However, the substrate material, the active layer material, and lasing wavelength are not limited to this example. Likewise, the present invention is applicable to another material such as an InGaAsP laser of 1.55 μm band.

Second Embodiment

Figure 8A:
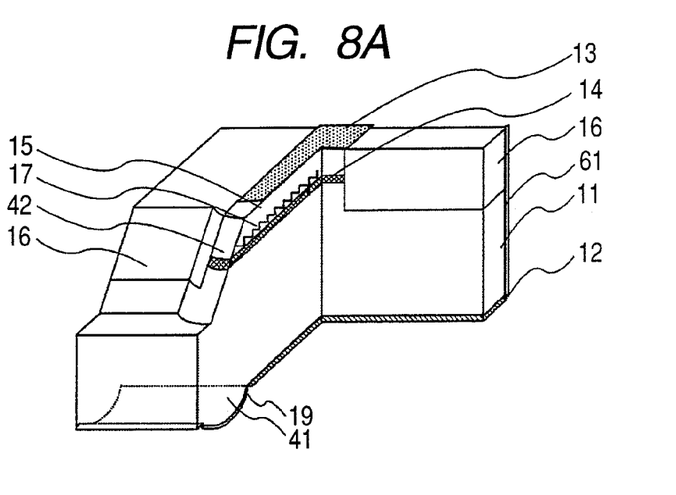
FIGS. 8A to 8D are diagrams for explaining a second embodiment of the present invention.
Figure 8B:
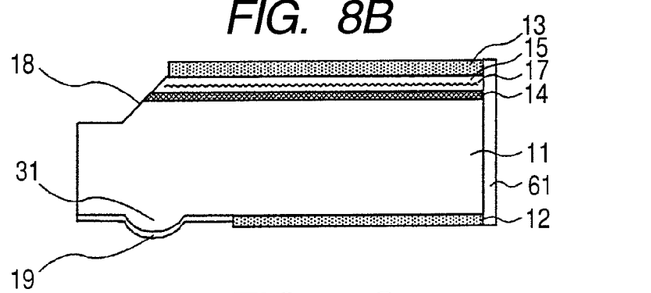
Figure 8C:
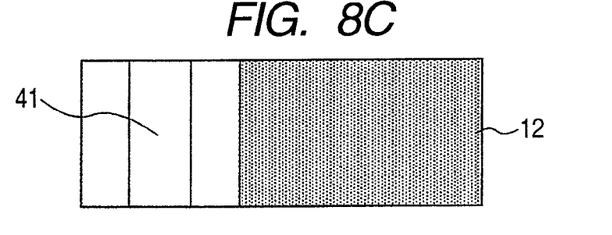
Figure 8D:
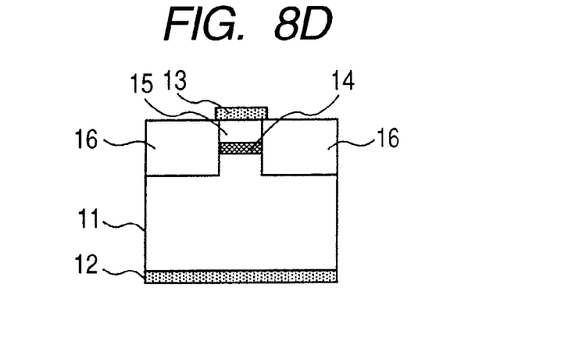

A second embodiment of the present invention will be described with reference to FIGS. 8A to 8D, 9A to 9E, and 10. This embodiment is directed to an InGaAsP quantum well horizontal cavity surface emitting laser having a wavelength of 1.3 μm band. FIG. 8A is a perspective view showing a cross section according to the second embodiment of the present invention. FIG. 8B is a cross-sectional view of a plane that is in parallel to the beam traveling direction. FIG. 8C is a diagram of a lower surface of the device. FIG. 9D is a cross-sectional view of a plane that crosses the beam traveling direction. FIGS. 9A to 9E are cross-sectional views showing a device manufacturing process. As shown in FIGS. 8A and 8D, the optical waveguide of the device is processed in the form of a stripe, and has a buried hetero structure. In this example, a ruthenium doped high-resistant semi-insulated InP 16 is buried in the periphery of the optical waveguide in the form of a stripe in the buried hetero structure.

Figure 9A:
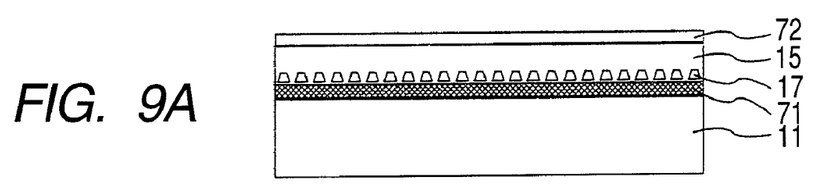
FIGS. 9A to 9E are diagrams for explaining a second embodiment of the present invention.

The cross-sectional view of a multiple layer structure according to this embodiment is shown in FIG. 9A. The substrate is an n-type InP substrate 11. An active layer 14 is of a multiple layer structure including an n-type InGaAlAs optical confinement layer, an InGaAsP multiple quantum well layer, and a p-type InGaAsP optical confinement layer. A grating 17 that is made of an InGaAsP material is formed above the active layer 14. The active region and the grating 17 are structured in such a manner that the lasing wavelength of a DFB laser at a room temperature becomes 1310 nm.

The polarity of the grating 17 is of p-type. This structure is called "index coupled DFB laser" since only the refractive index periodically changes in the beam traveling direction. In this embodiment, a description is given of an example in which the grating is uniformly formed on the entire region of the DFB laser. Alternatively, there can be provided so-called "phase shift" in which the phase of the grating is shifted in a part of the region as the occasion demands.

Subsequently, a manufacturing process according to this embodiment will be described with reference to FIGS. 9A to 9E. First, in order to form the structure of the laser, an InGaAsP active layer 14 consisting of an n-type InGaAsP optical confinement layer, an InGaAsP multiple quantum well layer, and a p-type InGaAlAs optical confinement layer is formed on the n-type InP substrate 11. Then, a multiple layer structure including the grating layer 17 that is made of InGaAsP is formed above the InGaAlAs active layer 14. Further, a p-type InP cladding layer 15 and a p-type InGaAs contact layer 72 are formed on the multiple layer structure (FIG. 9A). Subsequently, the optical waveguide of the buried hetero structure is formed by the aid of the same manner as that described in the first embodiment of the present invention. This embodiment is different from the first embodiment of the present invention in that the buried structure is formed only in a direction perpendicular to the beam traveling direction of the optical waveguide, and the buried structure is not formed in the beam emitting side leading portion of the optical waveguide.

Figure 9B:
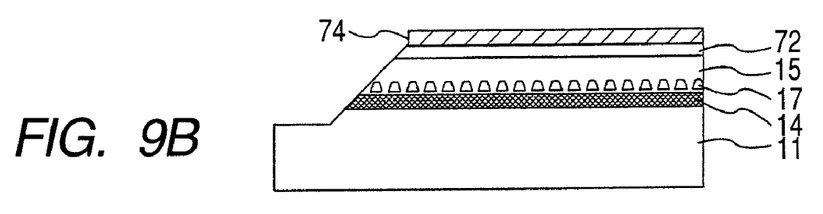

Subsequently, the silicon nitride mask 74 having a semi-circular end is formed on the multiple layer structure. As shown in FIG. 9B, the contact layer 72, the p-type cladding layer 15, the grating layer 17, and the active layer 14, and a part of the InP substrate are etched by the aid of the silicon dioxide mask 74, to thereby form a mirror that is inclined by 45°. In the etching, there is used a so-called chemically assisted ion beam etching technique that conducts etching by an argon ion beam while a chlorine gas is supplied to the substrate front surface. In this situation, etching is conducted while the substrate is inclined by 45° to form an etching surface with an angle of 45°. In this embodiment, a surface of the mirror to be processed is not the single InP material as in the first embodiment, but a multiple layer structure consisting of InGaAs, InP, and InGaAsP. As a result, the surface roughness of several nanometers is produced on the mirror front surface with the ununiformity of the etching rate. However, because the roughness is sufficiently small as compared with the wavelength of the laser beam, the reflection characteristics are not greatly adversely affected by the roughness. Then, after the silicon nitride film 74 has been removed, the p electrode 13 is deposited on the upper surface of the p-type InGaAs contact layer. In addition, after the substrate rear surface has been ground to the thickness of 90 μm, a photoresist mask 91 is formed on the substrate rear surface.

Figure 9C:
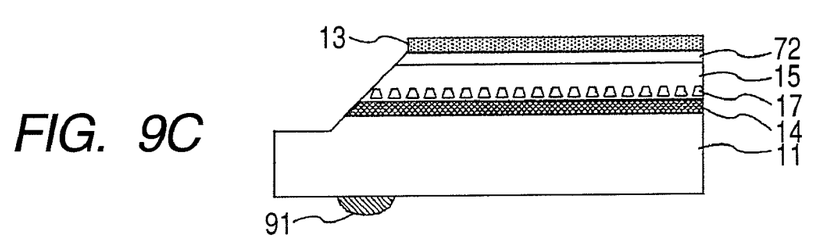
Figure 9D:
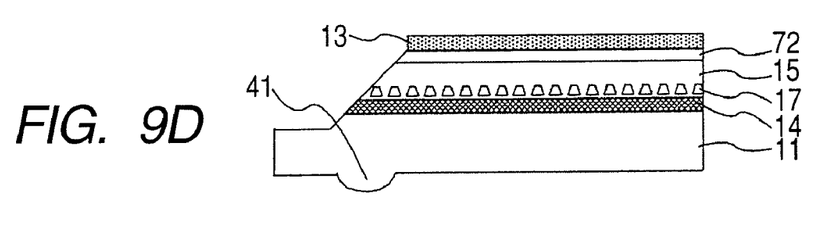
Figure 9E:
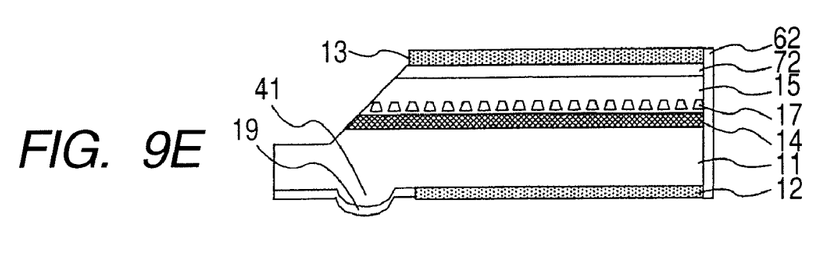

The photoresist mask has a stripe configuration formed in a direction (x-axial direction) perpendicular to the optical axial direction of the optical waveguide, and is then subjected to a heat treatment at 150° C., thereby provide a semi-circular cross-sectional configuration (FIG. 9C). Subsequently, the InP of the substrate rear surface is etched by ion beam etching of argon gas to transfer the columnar configuration of the photoresist mask to the InP substrate rear surface, thereby forming the bottom lens 41 having the configuration of the columnar front surface (FIG. 9D). As described above, both of the mirror and the bottom lens are configured into the columnar front surface, and the mirror and the bottom lens can be shaped in a direction parallel to the optical waveguide of the laser beam and in a direction perpendicular to the optical waveguide, independently, to thereby realize the circular narrow-divergence emitted beam. Then, the antireflective coating film 19 that is made of silicon nitrided oxide is formed on the front surface of the lens, and the n-side electrode 12 is also formed. Also, a highly reflective coating film 61 used for the general semiconductor optical device is formed on the rear facet of the device.

In the 1.3 µm band horizontal cavity surface emitting laser according to the present invention, an average value of the slope efficiency at a room temperature under the continuous-wave condition is 0.35 W/A, and the high-efficiency lasing characteristics are exhibited. Also, with the reflection of the advantages of the present invention, there is obtained a perfectly circular emitted beam having the beam spot configuration which is 100 µm in both of the diameter in the short axis and the diameter in the long axis at the position of 100 µm from the laser rear surface. On the other hand, in the 1.3 µm band horizontal cavity surface emitting laser having the 45° mirror of the planar configuration and the circular bottom lens laser device whose bottom lens configuration is circular, which has been fabricated for comparison in order to exhibit the advantages of the present invention, the beam spot at a position of 100 µm from the laser rear surface has the oval configuration that is 40 µm in the diameter of a shorter axis and 60 µm in the diameter of a longer axis.

As a result, it is found that the horizontal cavity surface emitting laser of the circular narrow-divergence emitted beam is obtained from the advantages of the present invention. Also, as a result of conducting a constant output power life test with 3 mW at 80° C. with respect to the laser device of the present invention, two million hours are obtained as an estimated mean time to failure, and it is proved that the laser device of the present invention is high in reliability.

Figure 10:
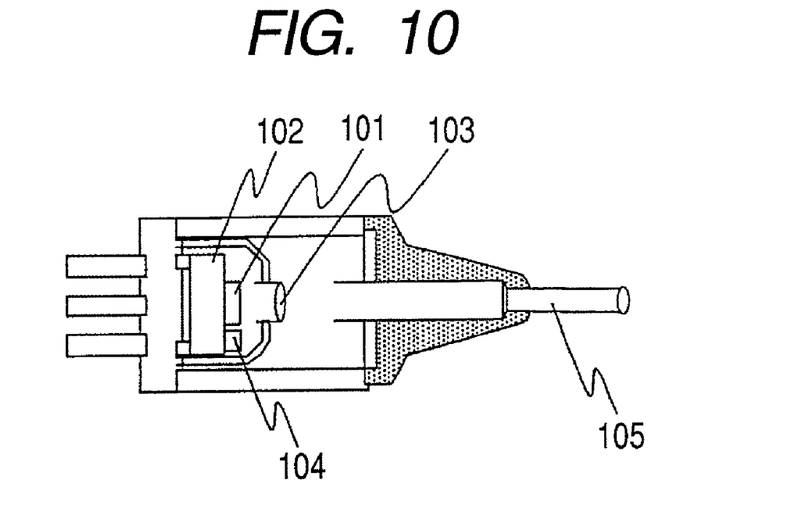
FIG. 10 is a diagram for explaining the second embodiment of the present invention.

FIG. 10 is a structural diagram showing an optical transceiver module into which an optical lens 103, a rear facet output power monitor photodiode 104, and an optical fiber 105 are integrated after the laser device 101 of the present invention is mounted on a heat sink 102. The threshold current is 5 mA, and the slope efficiency is 0.3 W/A at room temperature under the continuous-wave condition. Also, with the reflection of the circular narrow-divergence emitted beam according to the present invention, the optical coupling efficiency with the lens is high, and the highest module output power of 5 mW or higher is achieved. Also, with the reflection of the advantages of the present invention, the mounting of the device is easy, and it is possible to manufacture the optical transceiver module at the low costs.

Figure 11:
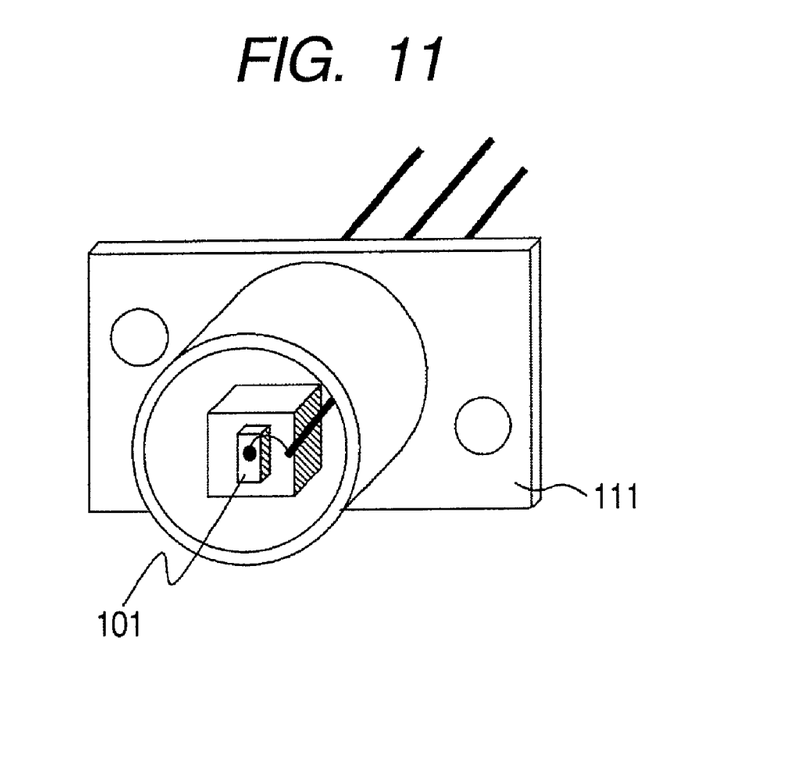
FIG. 11 is a diagram for explaining the second embodiment of the present invention.

Also, FIG. 11 shows an example of a can module in which the laser device 101 of the present invention is incorporated into a package 111 of the can type. A package that has been fabricated by a die press molding is used as a can module casing. With the reflection of the advantages of the present invention that the semiconductor laser emits the circular narrow-divergence emitted beam, the can module that emits the circular narrow-divergence emitted beam is obtained.

Third Embodiment

A third embodiment of the present invention will be described with reference to FIG. 12. This embodiment is directed to an example in which the semiconductor laser of the present invention is applied to an optical module used as a terminal of wavelength division multiplexing transmission that transmits beams of plural wavelengths by means of one optical fiber, or single-conductor bi-directional optical transmission.

Figure 12A:
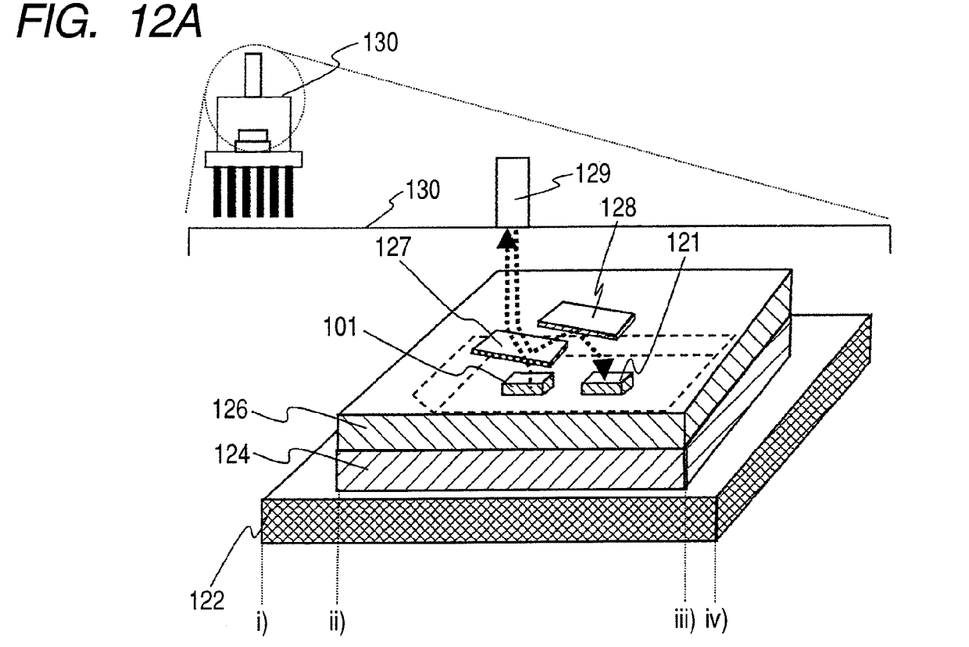
FIG. 12A is a perspective view of the third embodiment.
Figure 12B:
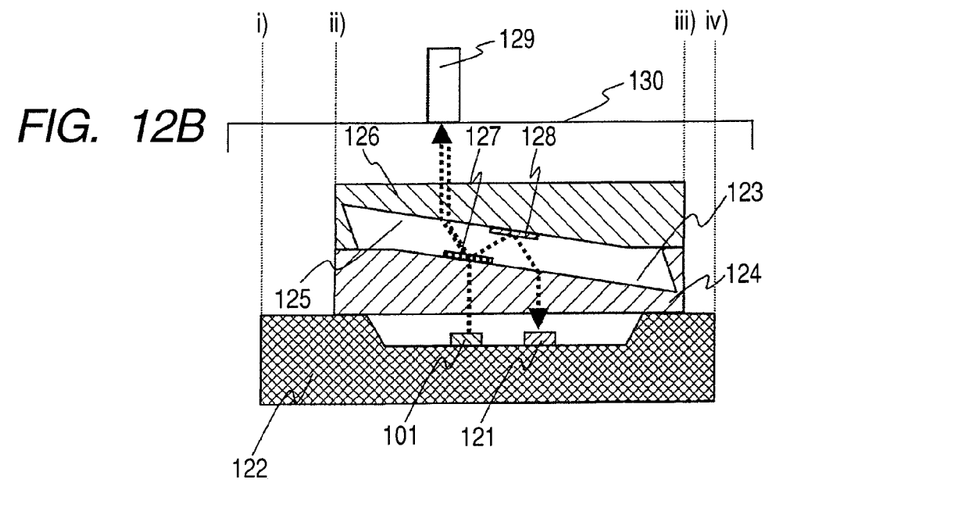
FIG. 12B is a lateral cross-sectional view of the third embodiment.

In the configuration of FIG. 12, there are disposed an optical device mounted substrate 122 on which the laser device 101 and the photodiode 121 according to the present invention are mounted on a line in a lateral direction of the substrate front surface, respectively, a first optical functions integrated substrate 124 having an angle with respect to the substrate parallel on one plane of the substrate, and providing a first inclined plane 123 for refracting the beam that propagates in a direction of the substrate thickness, and a second optical functions integrated substrate 126 similarly having an angle with respect to the substrate parallel on one plane of the substrate, and providing a second inclined plane 125 for refracting the beam that propagates in the direction of the substrate thickness, respectively. Also, in this configuration, the optical device mounted substrate 122, and the first and second optical functions integrated substrates 124 and 126 are laminated in the substrate thickness direction, respectively. The first and second wavelength selective filters 127 and 128 which are different in the wavelength transmittance of the propagating beam from each other are disposed in an optical path between the first inclined plane 123 and the second inclined plane 125, respectively. With the above configuration, the beam that is emitted from the laser device 101 of the present invention on the optical device mounted substrate 122 passes through the first optical functions integrated substrate 124, the first wavelength selective filter 127, and the second optical functions integrated substrate 126, and is optically connected to the optical fiber 129 that is disposed outside of the substrate. The optical fiber is fixed to the package 130.

Also, it is possible to provide the function of the single-conductor bi-directional optical transmission that the beam different in the wavelength from the emitted light of the laser device 101 which is emitted from the optical fiber 129 passes through the second optical functions integrated substrate 126, is reflected by the first wavelength selective filter 127 and the second wavelength selective filter 128, passes through the second optical functions integrated substrate 124, and is input to the photodiode 121 on the optical device mounted substrate 122. The material of the optical device mounted substrate 122, the first optical function integrated substrate 124, and the second optical functions integrated substrate 126 is made of Si.

Also, the propagated beam is bent by the inclined angles of the first and second inclined planes 123, 125 and the refractive index difference between the optical functions integrated substrates 124, 126, and their external material when passing through the first inclined plane 123 disposed on the first optical function integrated substrate 124 and the second inclined plane 125 disposed on the second optical functions integrated substrate 126, respectively. For that reason, the inclined angles of the first and second inclined planes 123 and 125 are made equal to each other so that the beam that is input or output perpendicularly with respect to the optical functions integrated substrate plane from the optical fiber 129 passes through the optical functions integrated substrates 124 and 126, and receives perpendicularly with respect to the laser device 101 on the optical device mounted substrate 122 and the photodiode 121. In this embodiment, with the reflection of the advantages of the present invention that the circular narrow-divergence emitted beam is emitted in the plane direction from the laser device, the tolerance of the optical alignment at the time of mounting the laser device is large, the mounting process is remarkably easy, and it is possible to manufacture the optical module at the low costs.

Fourth Embodiment

Figure 13:
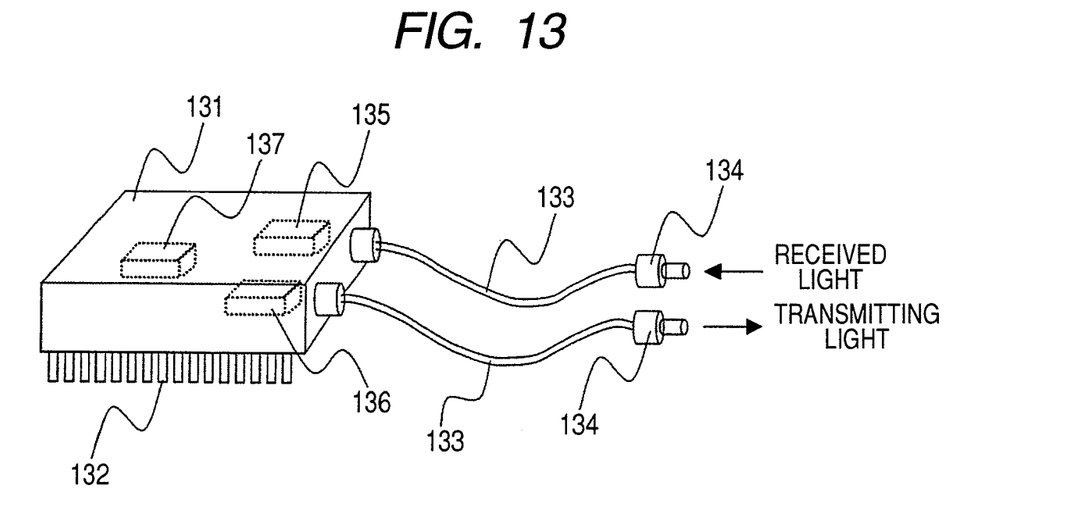
FIG. 13 is a diagram for explaining a fourth embodiment of the present invention.

A fourth embodiment of the present invention will be described with reference to FIG. 13. This example is directed to an example of an optical transceiver using the optical transceiver module according to the present invention. The optical transceiver of this embodiment includes an optical transceiver casing 131, an electric input/output pin 132, an optical fiber 133, an optical connector 134, a beam receiving module 135, a beam transmission module 136, and a signal processing control unit 137. The optical transceiver has a function of converting the received optical signal into an electric signal to output the electric signal to the external through the electric input/output pin 132, as well as a function of converting the electric signal that has been input from the external through the electric input/output pin 132 into an optical signal to transmit the optical signal. The optical fiber 133 is connected to the optical transceiver casing 131 at one end thereof, and is connected to the optical connector 134 at another end. The optical connector 134 has a structure that is capable of transmitting the received beam that has been input from the external optical transmission path to the optical fiber 133, and is also capable of transmitting the transmission beam that has been input from the optical fiber 133 to the external optical transmission path. With the reflection of the advantage of mounting the semiconductor laser that is high in the optical coupling efficiency according to the present invention, it is possible to manufacture the optical transceiver at the very low costs.

What is claimed is:

1. A semiconductor laser comprising:
 a semiconductor substrate;
 an active layer formed on a main surface of the semiconductor substrate which generates light;
 an optical waveguide for propagating the light that is generated from the active layer;
 a resonant cavity structure for optical feedback along the propagation direction;
 a mirror for reflecting the laser beam emitted from the cavity in a substrate rear surface direction;
 and a lens having a curved semiconductor surface at the substrate rear surface side for emitting the laser beam reflected by the mirror,
 wherein when the semiconductor substrate is in an xy plane of right-hand orthogonal coordinates, and the optical axial direction of the optical waveguide is in parallel to the x-axial direction, the normal direction to the mirror surface and the z-axial direction form an angle of 45°, and the laser beam is emitted in the substrate rear surface direction that is the negative direction of the z-axis,
 wherein the outer peripheral configuration of the lens, as viewed from the substrate rear surface side, is an oval configuration that satisfies the following relationship:

$a^{-2}x^2 + b^{-2}y^2 = 1$ where a and b are a radius in the x-axial direction and a radius in the y-axial direction, respectively, and satisfies a relationship of a<b;
 wherein a that represents the radius in the x-axial direction and b that represents the radius in the y-axial direction meets a relationship of 3 μm <a <b <200 μm.

2. The semiconductor laser according to claim 1, wherein the mirror has a plane configuration, and wherein the cross-sectional configuration of the lens in the y-axial direction has an oval curvature.

3. The semiconductor laser according to claim 2, wherein the lens is configured as to project toward an outer side of the rear surface of the semiconductor substrate.

* * * * *